United States Patent
Uzoh et al.

(10) Patent No.: US 9,379,008 B2
(45) Date of Patent: Jun. 28, 2016

(54) METAL PVD-FREE CONDUCTING STRUCTURES

(71) Applicant: Invensas Corporation, San Jose, CA (US)

(72) Inventors: Cyprian Emeka Uzoh, San Jose, CA (US); Charles G. Woychik, San Jose, CA (US); Michael Newman, Fort Collins, CO (US); Pezhman Monadgemi, Fremont, CA (US); Terrence Caskey, Santa Cruz, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/627,252

(22) Filed: Feb. 20, 2015

(65) Prior Publication Data
US 2015/0162241 A1 Jun. 11, 2015

Related U.S. Application Data

(62) Division of application No. 13/897,956, filed on May 20, 2013, now Pat. No. 8,981,564.

(51) Int. Cl.
*H01L 21/768* (2006.01)
*H01L 23/48* (2006.01)
*H01L 23/498* (2006.01)
(Continued)

(52) U.S. Cl.
CPC .... *H01L 21/76877* (2013.01); *H01L 21/32055* (2013.01); *H01L 21/76802* (2013.01); *H01L 21/76841* (2013.01); *H01L 21/76858* (2013.01); *H01L 21/76873* (2013.01); *H01L 21/76874* (2013.01); *H01L 21/76898* (2013.01); *H01L 23/481* (2013.01); *H01L 23/49816* (2013.01); *H01L 23/49827* (2013.01); *H01L 23/49866* (2013.01); *H01L 23/53233* (2013.01); *H01L 23/53238* (2013.01); *H01L 23/147* (2013.01); *H01L 23/525* (2013.01); *H01L 2224/16* (2013.01); *H01L 2924/0002* (2013.01)

(58) Field of Classification Search
CPC .............. H01L 2224/45147; H01L 21/76867; H01L 21/76864; H01L 21/76873; H01L 21/76846; H01L 23/53233; H01L 2924/16747; H01L 21/76877; H01L 23/53238; H01L 21/76841; H01L 21/32055; H01L 23/481; H01L 21/76802; H01L 21/76898; H01L 21/76858; H01L 21/76874
See application file for complete search history.

(56) References Cited

U.S. PATENT DOCUMENTS

| 6,083,829 A | 7/2000 | Lai et al. |
| 6,181,013 B1 | 1/2001 | Liu et al. |

(Continued)

FOREIGN PATENT DOCUMENTS

JP 2012216722 A 11/2012

OTHER PUBLICATIONS

International Search Report and Written Opinion for Application No. PCT/US2014/038711 dated Sep. 16, 2014.

*Primary Examiner* — Roy Potter
(74) *Attorney, Agent, or Firm* — Lerner, David, Littenberg, Krumholz & Mentlik, LLP

(57) ABSTRACT

Structures and methods of forming the same are disclosed herein. In one embodiment, a structure can comprise a region having first and second oppositely facing surfaces. A barrier region can overlie the region. An alloy region can overlie the barrier region. The alloy region can include a first metal and one or more elements selected from the group consisting of silicon (Si), germanium (Ge), indium (Id), boron (B), arsenic (As), antimony (Sb), tellurium (Te), or cadmium (Cd).

8 Claims, 5 Drawing Sheets

(51) Int. Cl.
*H01L 23/532* (2006.01)
*H01L 21/3205* (2006.01)
*H01L 23/14* (2006.01)
*H01L 23/525* (2006.01)

(56) References Cited

U.S. PATENT DOCUMENTS 6,214,731 B1 * 4/2001 Nogami ............ H01L 21/76843
257/E21.584
6,541,860 B1 4/2003 Woo et al.
6,551,872 B1 4/2003 Cunningham
6,660,634 B1 12/2003 Ngo et al.
7,407,881 B2 8/2008 Lee
8,072,075 B2 12/2011 Jourdan et al.
2010/0154213 A1 6/2010 Koike et al.
2010/0187693 A1 7/2010 Mountsier et al.
2010/0314758 A1 12/2010 Wu et al.
2011/0272664 A1 * 11/2011 Tada ..................... H01L 27/228
257/4
2011/0294231 A1 12/2011 Mevellec

* cited by examiner

METAL PVD-FREE CONDUCTING STRUCTURES

CROSS-REFERENCE TO RELATED APPLICATIONS

The present application is a divisional, of U.S. patent application Ser. No. 13/897,956, filed May 20, 2013, the disclosure of which is incorporated herein by reference.

FIELD OF THE INVENTION

The present application describes structures such as that which can be incorporated into a microelectronic assembly which may include an unpackaged semiconductor die or packaged semiconductor die, as well as methods for making such structures, which can be fabricated without using physical vapor deposition (PVD).

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically between about 0.005 mm and about 0.8 mm in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in microelectronics assemblies, the individual components thereof, such as interposers and microelectronics elements, and methods of making the same would be desirable.

BRIEF SUMMARY OF THE INVENTION

Structures and methods of making the same are disclosed herein. In one embodiment, a structure can comprise a region having first and second oppositely facing surfaces. A barrier region can overlie the region. An alloy region can overlie the barrier region. The alloy region can include a first metal and one or more elements selected from the group consisting of silicon (Si), germanium (Ge), indium (Id), boron (B), arsenic (As), antimony (Sb), tellurium (Te), or cadmium (Cd).

In one embodiment, the first metal includes one or more of copper (Cu), nickel (Ni), cobalt (Co) aluminum (Al), tin (Sn), gold (Au), molybdenum (Mo), or tungsten (W).

In one embodiment, the barrier region comprises at least one of silicon dioxide ($SiO_2$), silicon nitride (SiN) or silicon carbide (SiC), silicon oxycarbide (SiOC), or silicon oxynitride (SiON).

In one embodiment, the substrate comprises silicon (Si).

In one embodiment, the alloy region comprises copper-silicon (CuSi) or copper-germanium (Cute).

In one embodiment, the structure further comprises a metal region overlying the alloy region. The metal region can be one of electrolessly or electrolytically deposited.

In one embodiment, the metal region comprises at least one of copper (Cu), nickel (Ni), gold (Au), or aluminium (Al).

In one embodiment, the concentration of the one or more elements from the alloy region present in the metal region is less than about 1 atomic percent (atom %).

In one embodiment, the concentration of the one or more elements from the alloy region is not uniformly distributed within the metal region.

In one embodiment, the concentration of the one or more elements from the alloy region is uniformly distributed within the metal region.

In one embodiment, the metal region extends in a first direction of thickness through the region between the first and second surfaces, and is separated from the region by at least one of the barrier region, or the alloy region.

In one embodiment, the region further comprises one or more openings. Each opening can extend in a first direction from the first surface towards the second surface. The barrier region can overlie a wall of each opening.

In one embodiment, the structure further comprises a metal region overlying the alloy region, the metal region at least one of electrolessly or electrolytically deposited.

In one embodiment, the structure is an interposer and the metal region provides an electrically conductive path between the first and second surface.

In one embodiment, a structure can comprise a silicon region having first and second oppositely facing surfaces and including one or more openings. Each opening can extend in a first direction from the first surface towards the second surface. A barrier region can overlie a wall of each opening. The barrier region can include at least one of silicon nitride or silicon carbide. An alloy region can overlie the barrier region. The alloy region can include a first metal and at least one of silicon (Si), germanium (Ge), indium (Id), boron (B), arsenic (As), antimony (Sb), tellurium (Te), or cadmium (Cd).

In one embodiment, the structure further comprises a metal region overlying the alloy region, the metal region including an electrolessly or electrolytically deposited first metal.

In one embodiment, the first metal comprises one or more of copper (Cu), nickel (Ni), aluminum (Al), tin (Sn), gold (Au), molybdenum (Mo), or tungsten (W).

In one embodiment, a method of forming a structure can comprise depositing a first material comprising at least one of silicon (Si), germanium (Ge), indium (Id), boron (B), arsenic (As), antimony (Sb), tellurium (Te), or cadmium (Cd) overlying a first surface of a barrier region. The barrier region can overlie a first surface of a semiconductor region. A second material comprising a first metal can be deposited overlying the first surface of the barrier region. The first and second material can be heat treated to form an alloy region overlying the first surface of the barrier region.

In one embodiment, the method further comprises forming a metal region overlying the alloy region. The metal region formed by at least one of electrolessly or electrolytically depositing a second metal.

In one embodiment, depositing the first material can further comprise forming a layer comprising at least one of amorphous silicon or polysilicon.

In one embodiment, the first and second metals comprise copper (Cu).

In one embodiment, a method of forming a structure can comprise depositing a first material comprising at least one of silicon (Si), germanium (Ge), indium (Id), boron (B), arsenic (As), antimony (Sb), tellurium (Te), or cadmium (Cd) overlying a first surface of a barrier region. The barrier region can overlie a wall of at least one opening which extends in a first direction from a first surface towards an oppositely facing second surface of a semiconductor region. A second material comprising a first metal can be deposited overlying the first surface of the barrier region. The first and second material can be heat treated to form an alloy region overlying the first surface of the barrier region.

In one embodiment, the method further comprises forming a metal region overlying the alloy region, the metal region providing an electrically conductive path between the first and second surface.

In one embodiment, forming the metal region can further comprise at least one of electrolessly or electrolytically depositing a second metal to form the metal region.

In one embodiment, the first and second metals comprise copper (Cu).

In one embodiment a structure can comprise a region having first and second oppositely facing surfaces, the region comprising an insulating material. An adhesive layer can overlie the region. An alloy region can overlie the adhesive layer. The alloy region can include a first metal and one or more elements selected from the group consisting of silicon (Si), germanium (Ge), indium (Id), boron (B), arsenic (As), antimony (Sb), tellurium (Te), or cadmium (Cd).

In one embodiment, the first metal includes one or more of copper (Cu), nickel (Ni), cobalt (Co) aluminum (Al), tin (Sn), gold (Au), molybdenum (Mo), or tungsten (W).

In one embodiment, the insulating material includes borosilicate glass (BSG).

In one embodiment, the adhesive layer includes at least one of titanium (Ti) or chromium (Cr).

In one embodiment, the adhesive layer has a thickness of less than about 5 nm.

BRIEF DESCRIPTION OF THE DRAWINGS

FIG. 1-2 depicts a side schematic view of a structure in accordance with some embodiments of the present invention.

FIG. 1-3 depicts a side schematic view of a interposer in accordance with some embodiments of the present invention.

FIG. 1-4 depicts a top down schematic view of an interposer in accordance with some embodiments of the present invention.

FIG. 2-1 depicts a flow chart for a method of making a structure in accordance with some embodiments of the present invention.

FIGS. 3-1 through 3-5 depict stages of fabricating a structure in accordance with some embodiments of a method of the present invention.

DETAILED DESCRIPTION

Figure 1:
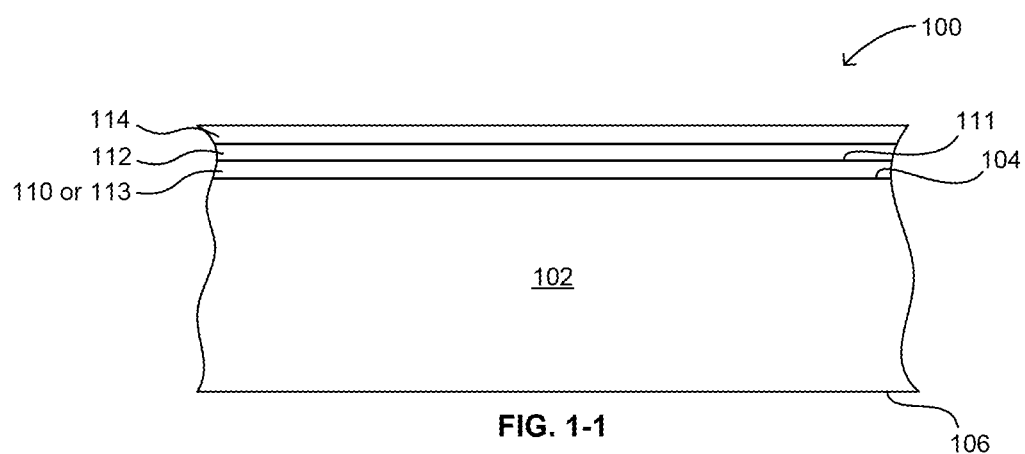
FIG. 1-1 depicts a side schematic view of a structure in accordance with some embodiments of the present invention.

The present invention will be described in more detail below.

All ranges recited herein include the endpoints, including those that recite a range "between" two values. Terms such as "about," "generally," "substantially," and the like are to be construed as modifying a term or value such that it is not an absolute, but does not read on the prior art. Such terms will be defined by the circumstances and the terms that they modify as those terms are understood by those of skill in the art. This includes, at very least, the degree of expected experimental error, technique error and instrument error for a given technique used to measure a value.

It should be further understood that a description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.3, 3, 4, 5, 5.7 and 6. This applies regardless of the breadth of the range.

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

Structures and methods of making the same are disclosed herein. Specifically, the structures may be incorporated into a microelectronics assembly, such as into components such as an interposer and/or microelectronics element. The structures of the present invention incorporate an alloy region, wherein the alloy region can be formed without using physical vapor deposition (PVD). The alloy region may be, for example, one or more seed materials and/or seed layers, and may be utilized to facilitate further deposition processes. PVD processes may be disadvantageous, for example, at high aspect ratios, such a ranging from about 20:1 to about 100:1, or higher than about 100:1, and may be inadequate to provide a continuous seed layer. Moreover, to achieve an adequate coverage at high aspect ratios, a PVD seed layer can be undesirably thick, for example ranging between about 1.5 to about 6 microns depending on aspect ratio. For example, the higher the aspect ratio the thicker the PVD seed layer that is required. A thicker PVD seed layer is more expensive than thinner seeds due in part to lower through put. Moreover, a thicker PVD seed layer can induce higher film stress on the substrate, and also, it takes longer to remove in subsequent processes, such as chemical mechanical planarization (CMP). Forming thicker PVD seed layers also reduce the life of the sputtering target. Generally, thicker PVD seed layers increase the net cost of ownership for the immediate and one or more subsequent steps.

PVD may be disadvantageous for forming barrier layers as well, for similar reasons as discussed above, and may require barrier layers ranging from about 500 nm to about 15,000 nm in thickness. In some examples, the barrier layer may require expensive materials, such as one or more of tungsten (W), tantalum (Ta), titanium (Ti), or alloys thereof. The conformality of a PVD barrier layer can be marginally better than that of a PVD seed layer, for example, ranging from about 3 to about 5% at aspect ratios of about 10:1 as compared to about 1 to about 3% for a PVD seed layer. However, both PVD seed and barrier layers are typically discontinuous at higher aspect ratios, such as greater than about 10:1. At such higher aspect ratios, much thicker PVD seed and barrier layers are needed, and require elaborate massive resputtering protocols to achieve marginally continuous seed and barrier layers. For example, using such protocols, portions of PVD seed and/or barrier layers in the lower portion of a high aspect ratio feature may be continuous and thinner than about 3 nm. These thin regions of PVD seed and/or barrier layers may dissolve during plating, producing defects in a plated region formed thereon.

A method according to one implementation forms an alloy region, e.g., an alloy seed layer, that can be continuous and more conformal that a seed layer formed by PVD. In some embodiments, the alloyed seed layer is more resistant to etching during a plating process than an unalloyed seed layer form by PVD or other processes. The alloy region may have a more uniform thickness over its coverage area. The alloy region is also thinner than a PVD seed layer especially along the sidewalls in an upper portion of a high aspect ratio feature and along the surface of a substrate, for example, ranging from about 2 nanometers (nm) to about 200 nm.

A method according to one implementation forms a barrier region that can be more conformal and may have a more continuous uniform thickness over its coverage area than a PVD barrier layer. The barrier region may be thinner, for example, ranging from about 5 nm to about 200 nm. Moreover, the barrier region may be formed using less expensive materials and coating processes, while still providing sufficient barrier to metals such as copper (Cu).

FIGS. 1-1 to 1-4 depict various embodiments of a structure and process in accordance certain implementations disclosed herein. The structure, for example, may be utilized in any aspects of a microelectronics assembly, such as for interconnect structures and/or microelectronic elements. For example, the structure may be utilized as a via, such as a through silicon via (TSV) or for other interconnect structures. For example, the structure can be utilized in a microelectronic element, such as part of a logic device, and/or providing electrically connectivity between one or more logic devices on a microelectronic element and/or to adjacent microelectronic elements.

FIG. 1-1 depicts a structure in accordance with some embodiments of the present invention. A structure 100 may include a region 102 having a first surface 104 and an oppositely facing second surface 106. The region 102 may be a substrate of dielectric, semiconductor, or other material, or combinations thereof, such as, for example, a silicon wafer or another suitable substrate. In one embodiment, the region 102 may include silicon.

The structure 100 can include a barrier region 110 at the first surface 104 of the region 102. The barrier region 110 can be deposited, such as by any suitable process, for example, chemical vapor deposition (CVD) or plasma enhanced chemical vapor depositions (PECVD), or atomic layer deposition (ALD), or may be grown by reacting materials of the region 102 with a reagent, such as by using an oxidation process or the like. In some embodiments, the barrier region 110 may include silicon oxide ($SiO_x$), silicon carbide (SiC), silicon oxycarbide (SiOC), silicon nitride (SiN), or silicon oxynitride (SiON), or combinations thereof. The barrier region 110 may range in thickness between about 5 nm to about 200 nm.

The barrier region 110, for example, may be utilized as a barrier to limit or prevent diffusion of materials into or through the region 102 which can contaminate and degrade the substrate or the dielectric region, degrade device performance or may lead to an electrical short with the region 102, and/or other unwanted electrical or reliability defects. Many variants of the barrier region 110 may be possible, such as, including a barrier region having one or more layers. For example, a barrier region may include a first layer overlying the region 102 and a second layer overlying the first layer. The first layer may be an electrically insulating layer, such as a dielectric layer. The second layer may be a chemical insulating layer, such as to limit the diffusion of elements into the region 102. The positioning of the first and second layers within the barrier region 110 can be reversed in some embodiments. In some embodiments, the first and second layers can be made of different materials.

The structure 100 may include an alloy region 112 overlying the barrier region 110. The alloy region 112 may include one or more layers of conducting materials. The conducting materials can include metals, metalloids, and combinations thereof. In some embodiments, the alloy region 112 may be utilized as a seed for electroless or electrolytic deposition of a metal region as discussed below. The alloy region may range in thickness between about 5 nm to about 200 nm. In one embodiment, the alloy region may include a first metal alloyed with at least one semiconductor material. The first metal may include copper (Cu), nickel (Ni), aluminum (Al), indium (In), tin (Sn), gold (Au), molybdenum (Mo), tungsten (W), cobalt (Co), cadmium (Cd) alloys thereof, or combinations thereof. The semiconductor material may include at least one metalloid, for example, such as silicon (Si), germanium (Ge), boron (B), arsenic (As), antimony (Sb), tellurium (Te), or combinations thereof. In some embodiments, the alloy region 112 may include CuSi, CuGe, or CuSiGe. In one embodiment, the alloy region may include at least one of CuCd or CuSiCd. In one embodiment, the alloy region 112 may comprise a conformal and continuous polymeric layer deposited by, for example, one or more aforementioned methods. The polymeric layer may be activated with palladium for electroless coating of conducting material.

The structure 100 may include a metal region 114 overlying the barrier region 110. The metal region 114 may be deposited by at least one of electroless or electrolytic deposition. The metal region may comprise the first metal and/or a second metal. In some embodiments, the metal region comprises the first metal. In one example, the first metal is Cu. The second metal may include one or more of Ni, W, alloys thereof, or combinations thereof.

Figures 1, 2:
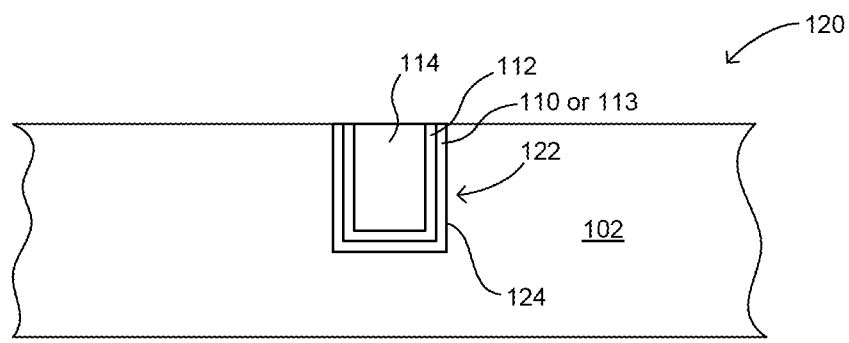

FIG. 1-2 depicts a structure in accordance with some embodiments of the present invention. A structure 120 includes the region 102. As shown in FIG. 1-2, the region 102 may include one or more openings 122. Each opening 122 may extend in a first direction from the first surface 104 towards the second surface 106. The one or more openings 122 may have an aspect ratio ranging from about 20:1 to about 50:1. In one example, the one or more openings may have an aspect ratio of about 50:1 or higher. The barrier region 110 may be at a wall 124 of each opening 122. The metal region 114 may fill a remainder of each opening 122. Each of these regions 102, 110, 112, 114 can include any embodiments and/or permutations thereof as described above in connection with FIG. 1-1.

Alternatively, some embodiments of the structure need not include a barrier region 110. For example, in some embodiments, the region 102 may include an insulating material. Exemplary insulating materials can include glass, silicon dioxide, borosilicate glass (BSG) or the like. The alloy region, which is formed by methods disclosed herein, may have difficultly adhering to these materials. Accordingly, an adhesive layer 113 may be deposited overlying the region 102 as illustrated in FIG. 1-1 through 1-2. The adhesive layer 113 may include titanium (Ti) or chromium (Cr). The adhesive layer 113 may have a thickness of less than about 5 nm. The adhesive layer 113 can be deposited by sputtering or the like.

Figures 1, 2, 3:
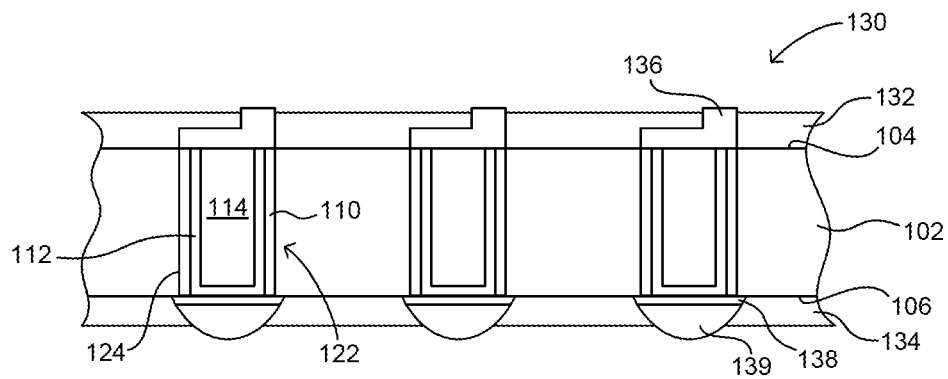

The structure 120 may be utilized in microelectronics assemblies, for example, as part of a microelectronic element or an interposer. One such exemplary interposer is depicted in FIGS. 1-3 and 1-4. As shown in side schematic view in FIG. 1-3, an interposer 130 may include the structure 120. For example, the interposer 130 may include layers 132, 134 at the first and second surfaces 104, 106, respectively. The layers 132, 134 may be one of redistribution (RDL) layers or back end of line (BEOL) layers. The layers 132, 134 may include contacts 136, 138, respectively, for connection to other components of a microelectronics assembly. At least some of the structure 120 may electrically connect contacts 136 and 138. For example, material may be locally and selectively removed at the second surface 106 of the region 102 to expose at least one of the alloy region 112 or the metal region 114 at the second surface 106 to form an electrical connection with contact 138. Though illustrated as a pad or post (contact 136) and as a pad (contact 138), the contacts 136, 138 can be any type of contact know in the art. In one example, as depicted in FIG. 1-3, a joining element 139, such as a solder ball or other joining elements can overlie a contact, such as contact 138. The joining elements can be utilized to electrically connect the structure 120 to another component of a microelectronic assembly. The interposer 130 may have any suitable shape, for example, such as a framed region having a central aperture 140 as illustrated in top down schematic view in FIG. 1-4. Within the central aperture may be disposed a microelectronic element or other components of a microelectronics assembly.

Possible applications for the structures can include interposer, through silicon via (TSV), capacitor structures, e.g., capacitors of memory cells in DRAM, or the like. The structures may further advantageous at high aspect ratios, e.g., about 50:1 or higher.

FIG. 2 depicts a flow chart of a method 200 for fabrication of a structure in accordance with some embodiments of the present invention. The method 200 is described below in accordance with the stages of fabrication of the structure 120; however, the method 200 may be applied to other embodiments of the present invention, such as the structure 100, or other structures.

As depicted in FIG. 3-1, the region 102 may be provided having the one or more openings 122 formed therein. The barrier region 110 may be formed at walls 124 of each opening 122. The barrier region 110 can serve as both an electrically insulating and chemical insulating region. At 202, a first material 302 may be deposited at a first surface 111 of the barrier region 110. The first material may include at least one of Si, Ge, B, As, Sb, Te, Cd or combinations thereof. The first material 302 may be deposited by any suitable process such as CVD, low pressure chemical vapor deposition (LPCVD), PECVD, electron cyclotron resonance (ECR), ALD or the like at temperatures below about 250 degrees Celsius. When using a chemical deposition process, the first material may be deposited from one or more precursors, or may be included in one or more precursors which are deposited at the first surface 111. For example, for silicon deposition, the one or more precursors can include one or more of silane ($SiH_4$), mixtures of silane and nitrogen, mixtures a silane moiety and hydrogen, or the like to deposit, for example, an amorphous silicon and/or polysilicon layer at temperatures below about 350 degrees Celsius. For example, a layer of Ge may be deposited from organogermanium precursors, for example, alkygermanium complexes such as dimethylaminogermanium trichloride. In one embodiment, the deposited first material 302 may be annealed or crytallized with laser crystallization prior coating with a second material at 204.

At 204, a second material 304 may be deposited at the first surface 111 of the barrier region 110 as illustrated in FIG. 3-2. In some embodiments, the second material may include the first metal. For example, the second material may be a precursor including the first metal, where the precursor is deposited at the first surface, and further reacted. In some embodiments, the second material may be the first metal. For example, one or more precursors including the first metal may react above the first surface, and the first metal may be deposited at the first surface 111. The second material 304 may be deposited by the same processes as used to deposit the first material 302. Further, the first and second materials 302, 304 may be deposited in any order or simultaneously. In one embodiment, the second material may be deposited by electroless or electrolytic plating methods. In one embodiment, a second material 304, such as copper, nickel, cobalt, cadmium or alloys thereof may be deposited electrochemically from a resistive metal plating bath containing strong metal complexing agents and small concentrations of metal ions, nominally less than about 0.1M, or ranging from about 0.05 to about 0.001M. The pH of the bath may range from about 7 to about 11. The deposition temperature may range from below about 5 degrees Celsius to about 75 degrees Celsius.

Figures 1, 2, 3, 4:
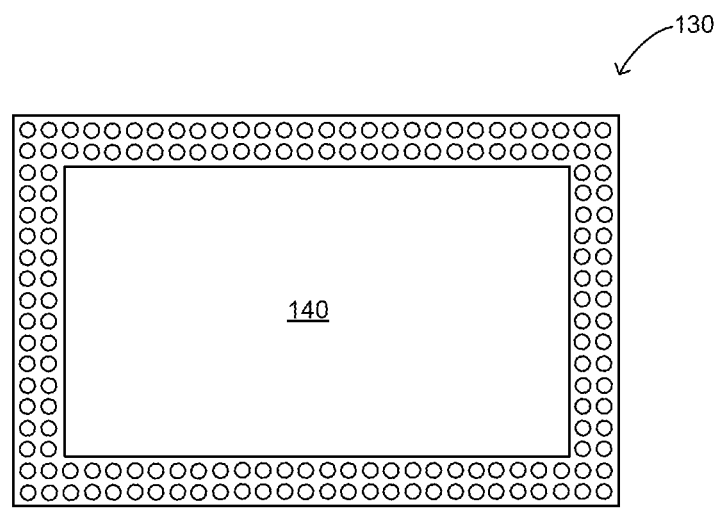
Figures 1, 2:
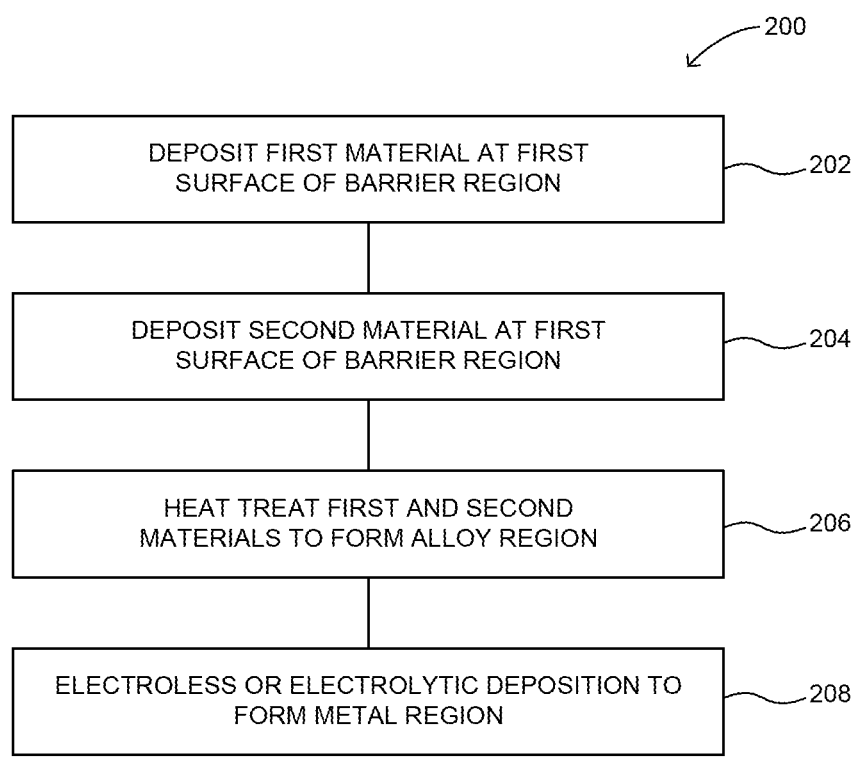

At 206, the first and second materials 302, 304 may be heat treated to form the alloy region 112 as illustrated in FIG. 3-3. The heat treatment may be performed at temperatures ranging from about 80 to about 420 degrees Celsius. In one embodiment, the deposited first material 302 and second material 304 may be heat treated using laser or multifrequency microwave crystallization methods to form alloys, such as silicides or germinides, for example, such as copper silicide or copper germinide. The laser annealing treatment can reduce the resistivity of the first and second materials 302, 304 prior to one or more subsequent processing step. The heat treatment may be performed under one or more of vacuum, in an inert atmosphere, or in reducing or inert atmosphere containing alcohol moieties. At 208, the metal region 114 may be formed using at least one of electroless or electrolytic deposition as illustrated in FIG. 3-4. It may be possible to deposit metal region 114 entirely by electrolytic deposition because of the pre-existence of alloy region 112 which can function as an electrical communing layer during the electroplating process. The metal region 114 may fill a remaining portion of the opening and overlying the alloy region 112. The alloy region 112 may facilitate a uniform deposition of the metal region 114, which may be substantially free of voids due to a conformal coating of the alloy region 112 within the opening 122.

Figures 1, 3:
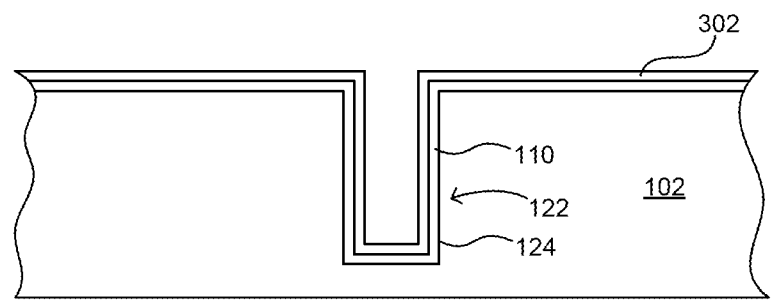
Figures 2, 3:
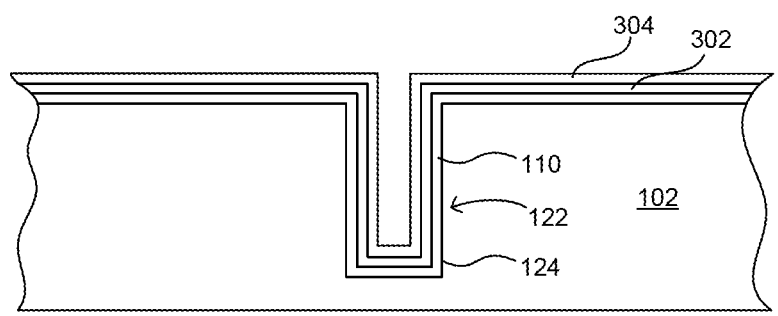
Figure 3:
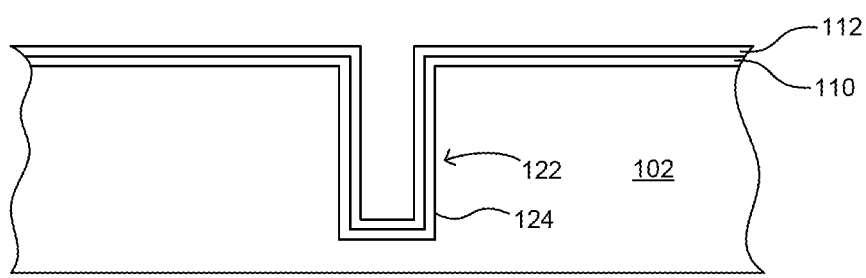
Figures 3, 4:
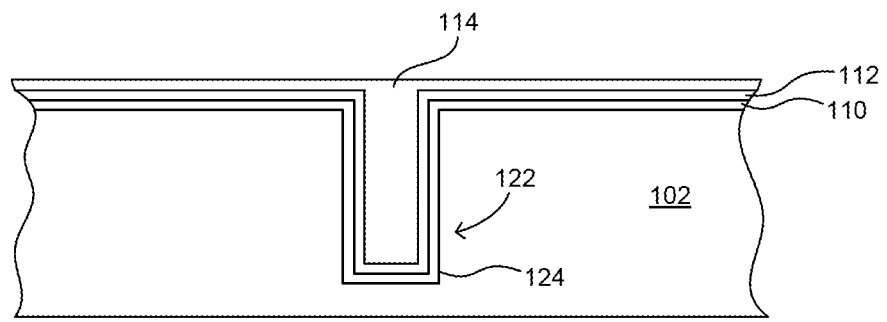
Figures 3, 4, 5:
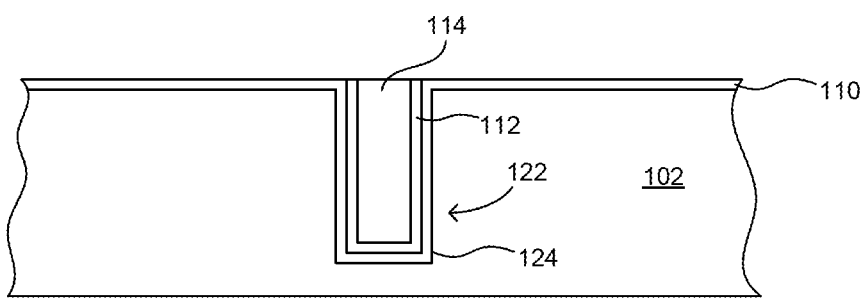

As shown in FIG. 3-5, material from the metal region 114 may be removed, for example, such as portions overlying the first surface 102 and the opening 122. The material may be removed by any suitable process such as chemical mechanical planarization (CMP), etching, or the like. In one embodiment, the grains in the metal region may be stabilized by thermal treatment prior to the planarization process. Thermal stabilization treatment can incorporate one or more impurities into the metal region 114. Impurities can include, for example, materials from one or more of the region 102, the barrier region 110, or the alloy region 114. The level of impurities within the metal region can be less than about 2 atomic percent (atomic %), and preferably less than about 1.5 atomic %, and more preferably less than about 1 atomic %. After the thermal stabilization treatment, some elements from the alloy region 112 can diffuse into the metal region 114. After the thermal treatment step, in one embodiment, such as in an example, where the alloy region includes silicon and cadmium, the concentration of silicon within the metal region 114 is less than about 1 atomic percent (atomic %), preferably less that about 0.5 atomic %, and the concentration of cadmium is less than about 2 atomic % and preferably less than about 0.2 atomic % in metal region 114. In one embodiment, where the alloy region includes boron, the concentration of boron within the metal region is less than about 200 ppm and preferably less than about 50 ppm by atomic concentration. In one embodiment, where the alloy region includes one or more of silicon, boron, germanium, cadmium and indium, the total concentration of those elements from the alloy region that diffuse into the metal region is less than about 1.5 atomic % and preferably less than about 1 atomic %. The distribution of elements, such as silicon, indium, cadmium, and/or boron, of the alloy region 112 that diffuse into the metal region 114 can be uniform or not uniform. The incorporation of very small amount of impurities in the metal region 114, such as one or more elements that diffuses from the alloy region 112, such as silicon, indium, germanium, cadmium and/or boron can improve mechanical strength and fatigue life of the metal region 114 by more than about 50% without substantially increasing the electrical resistance of the metal region 114. Alternative or additional benefits of incorporation of impurities into the metal region 114, such as elements from the alloy region, can include higher electromigration lifetimes for devices, such devices including wiring structures, e.g., RDL and/or BEOL structures, or other devices. In another embodiment, a portion of the material may be removed, for example, such as up to about 0.3 to about 2 microns of thickness remaining above the alloy region 112. Then, the metal region may be stabilized, followed by removal of the remaining portion of the material up to about the first surface 111 of the barrier region 110. In yet another embodiment, a portion of the material may be removed, for example, such as up to about 2 to about 5 microns of thickness remaining above the alloy region 112. The top surface of the metal region 114 is then patterned for redistribution wiring, and the unwanted portions of the metal region 114 and/or other regions overlying the barrier region 110 are removed, such as by etching. The structure can be cleaned and thermally treated to stabilize the grain structure.

The methods disclosed herein may be further advantageous for high aspect ratio features. For example, the inventive methods can allow for the use of 200 um thick wafers which do not require special handling and bond-debond processing of thin wafers. In contrast, PVD processes can require thinner wafers, which require special handling and bond-debond processing. Limitations of bond-debond processes can include throughput, and temperature range. For example, adhesives for bonding can be used at temperatures up to about 250 degrees Celsius. However, by not requiring thinner wafers, the inventive methods can including processing up to about 600 degrees Celsius, an higher throughput.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a structure, comprising:
   depositing a first material comprising at least one of silicon (Si), germanium (Ge), indium (Id), boron (B), arsenic (As), antimony (Sb), tellurium (Te), or cadmium (Cd) overlying a first surface of a barrier region, the barrier region overlying a first surface of a semiconductor region;
   depositing a second material comprising a first metal overlying the first surface of the barrier region; and
   heat treating the first and second material to form an alloy region overlying the first surface of the barrier region.

2. The method of claim 1, further comprising:
   forming a metal region overlying the alloy region, the metal region formed by at least one of electrolessly or electrolytically depositing a second metal.

3. The method of claim 2, wherein depositing the first material further comprises:
   forming a layer comprising at least one of amorphous silicon or polysilicon.

4. The method of claim 2, wherein the first and second metals comprise copper (Cu).

5. A method of forming a structure, comprising:
   depositing a first material comprising at least one of silicon (Si), germanium (Ge), indium (Id), boron (B), arsenic (As), antimony (Sb), tellurium (Te), or cadmium (Cd) overlying a first surface of a barrier region, the barrier region overlying a wall of at least one opening which extends in a first direction from a first surface towards an oppositely facing second surface of a semiconductor region;
   depositing a second material comprising a first metal overlying the first surface of the barrier region; and
   heat treating the first and second material to form an alloy region overlying the first surface of the barrier region.

6. The method of claim 5, further comprising:
   forming a metal region overlying the alloy region, the metal region providing an electrically conductive path between the first and second surface.

7. The method of claim 6, wherein forming the metal region further comprises:
   at least one of electrolessly or electrolytically depositing a second metal to form the metal region.

8. The method of claim 7, wherein the first and second metals comprise copper (Cu).

* * * * *